US008887657B2

(12) United States Patent
Ooshiro et al.

(10) Patent No.: US 8,887,657 B2
(45) Date of Patent: Nov. 18, 2014

(54) FILM FORMING SYSTEM AND METHOD USING APPLICATION NOZZLE

(75) Inventors: Kenichi Ooshiro, Yokohama (JP); Tsuyoshi Sato, Yokohama (JP); Takao Tokumoto, Sasayama (JP); Sadao Natsu, Ikoma (JP); Souichirou Iwasaki, Sakai (JP)

(73) Assignees: Kabushiki Kaisha Toshiba, Tokyo (JP); Chugai Ro Co., Ltd., Osaka-shi (JP)

( * ) Notice: Subject to any disclaimer, the term of this patent is extended or adjusted under 35 U.S.C. 154(b) by 517 days.

(21) Appl. No.: 12/795,259

(22) Filed: Jun. 7, 2010

(65) Prior Publication Data

US 2010/0310757 A1  Dec. 9, 2010

(30) Foreign Application Priority Data

Jun. 8, 2009  (JP) ................................ P2009-137192

(51) Int. Cl.
*B05C 11/08* (2006.01)
*B05B 5/00* (2006.01)
(Continued)

(52) U.S. Cl.
CPC ........ *H01L 21/6715* (2013.01); *B05B 15/0266* (2013.01); *B05B 15/025* (2013.01); *B05C 11/08* (2013.01); *B05B 12/08* (2013.01); *B41J 2/165* (2013.01); *B41J 2/16579* (2013.01); *B05C 5/0291* (2013.01); *B05D 1/005* (2013.01); *H01L 21/67051* (2013.01); *B05C 5/0216* (2013.01)
USPC ............. 118/52; 118/300; 118/663; 118/668; 118/712; 118/321; 134/198; 134/153

(58) Field of Classification Search
CPC .. B05B 12/08; B05B 15/025; B05B 15/0266; H01L 21/6715; B41J 2/16579; B41J 2/165
USPC ........... 118/52, 663–682, 300–319; 134/198, 134/153, 11, 104.2, 186, 34; 396/611
See application file for complete search history.

(56) References Cited

U.S. PATENT DOCUMENTS 6,383,948 B1 * 5/2002 Kitano et al. .................... 118/52
7,473,318 B2 * 1/2009 Jung et al. ..................... 118/302
(Continued)

FOREIGN PATENT DOCUMENTS

JP  9-320950 A  12/1997
JP  2000-223403 A  8/2000
(Continued)

OTHER PUBLICATIONS

Korean Office Action issued on Jul. 11, 2011 in corresponding Korean Application No. 10-2010-0053275.
(Continued)

*Primary Examiner* — Dah-Wei D Yuan
*Assistant Examiner* — Binu Thomas
(74) *Attorney, Agent, or Firm* — Oblon, Spivak, McClelland, Maier & Neustadt, L.L.P.

(57) ABSTRACT

According to one embodiment, a film forming system includes: a stage including a placement surface on which an object to be coated is placed; a rotating mechanism rotating the stage in a rotational direction along the placement surface; an application nozzle discharging a material onto the object placed on the stage for application; a moving mechanism relatively moving the stage and the application nozzle along the placement surface in a cross direction crossing the rotational direction; a controller performing a control to rotate the stage on which the object is placed through the rotating mechanism while relatively moving the stage and application nozzle along the placement surface in the cross direction through the moving mechanism and applying the material to the object on the stage through the application nozzle; and a cleaning apparatus cleaning the application nozzle.

7 Claims, 6 Drawing Sheets

(51) Int. Cl.
*B05B 3/04* (2006.01)
*H01L 21/67* (2006.01)
*B05B 15/02* (2006.01)
*B05B 12/08* (2006.01)
*B41J 2/165* (2006.01)
*B05C 5/02* (2006.01)
*B05D 1/00* (2006.01)

(56) References Cited

U.S. PATENT DOCUMENTS

| | | | |
|---|---|---|---|
| 2002/0124798 A1* | 9/2002 | Kitano et al. | 118/300 |
| 2003/0155373 A1* | 8/2003 | Kweon et al. | 222/148 |
| 2003/0189604 A1* | 10/2003 | Bae et al. | 347/2 |
| 2005/0126589 A1* | 6/2005 | Horie et al. | 118/302 |
| 2007/0199579 A1* | 8/2007 | Hayasaki et al. | 134/2 |
| 2008/0023034 A1* | 1/2008 | Hirao et al. | 134/11 |
| 2010/0098869 A1* | 4/2010 | Kinoshita | 118/663 |

FOREIGN PATENT DOCUMENTS

| | | |
|---|---|---|
| JP | 2001-176781 A | 6/2001 |
| JP | 2001-310155 | 11/2001 |
| JP | 2002-96013 A | 4/2002 |
| JP | 2002096013 A * | 4/2002 |
| JP | 2002-320902 | 11/2002 |
| JP | 2003-117477 | 4/2003 |
| JP | 2004-267871 A | 9/2004 |
| JP | 2004-337709 A | 12/2004 |
| JP | 2005-205329 A | 8/2005 |
| JP | 2006-49630 A | 2/2006 |
| JP | 2007-94341 A | 4/2007 |
| KR | 2001-0067387 A | 7/2001 |
| KR | 2002-0046908 A | 6/2002 |

OTHER PUBLICATIONS

Japanese Office Action issued on Jul. 12, 2011 in corresponding Japanese Application No. 2009-137192 (with an English Translation).

U.S. Appl. No. 13/528,012, filed Jun. 20, 2012, Ooshiro et al.

* cited by examiner

FILM FORMING SYSTEM AND METHOD USING APPLICATION NOZZLE

CROSS REFERENCE TO RELATED APPLICATIONS AND INCORPORATION BY REFERENCE

This application is based upon and claims the benefit of priority from prior Japanese Patent Application P2009-137192 filed on Jun. 8, 2009; the entire contents of which are incorporated by reference herein.

FIELD

Embodiments described herein relate generally to a system and a method for forming a film.

BACKGROUND

In a semiconductor field or the like, when a round film is framed on a disk-shaped substrate, the variation in thickness of the film is required to be 0.1 to 1.0 µm. To obtain the variation in thickness of the film within the intended range, the film formation is performed by spin coating. The spin coating includes: fixing a disk-shaped substrate on a circular rotary stage; applying a necessary amount of material to the center of the substrate; spinning the rotary stage at high speed to spread the material on the rotary stage over the entire surface of the substrate by centrifugal force, thus foaming a film.

The material scatters during the spin coating, and the material use efficiency of the spin coating is as low as about 30%. Moreover, a cover is provided around the rotary stage to prevent the apparatus from being contaminated by the scattered material. The cover needs to be regularly cleaned, and the conditions for the application are set for each cleaning work. This requires a certain amount of maintenance time, thus reducing the operation rate of the film forming system.

As a means for improving the problems of the spin coating, there is a spiral coating method. The spiral coating method includes: fixing a disk-shaped substrate to the circular rotary stage; spinning the rotary stage with a gap between the outlet surface of the application nozzle and the surface of the substrate being kept at a predetermined value; causing the material to be discharged from the application nozzle with a metering pump, which is capable of controlling the flow rate, while linearly moving the application nozzle from the center of the substrate to the periphery to form a spiral application trajectory, thus forming a film on the entire surface of the substrate.

In the aforementioned spiral coating, the material scatters less than that in the spin coating and is therefore effective on an improvement in the material use efficiency. Furthermore, the spiral coating does not need the cover for preventing the material from scattering. In the spiral coating, the regular cleaning of the cover, which is necessary for the spin coating, is eliminated, thus shortening the maintenance time. The spiral coating is therefore effective on an increase in the operating rate. However, in this method, the application forms the spiral trajectory, and the application nozzle brought close to the substrate moves along the spiral trajectory. The application nozzle is therefore more susceptible to contamination than the spin coating, and the contamination increases the variation in film thickness, thus resulting in low uniformity of the film thickness.

DETAILED DESCRIPTION

In general, according to one embodiment, a film forming system includes: a stage including a placement surface on which an object to be coated is placed; a rotating mechanism rotating the stage in a rotational direction along the placement surface; an application nozzle discharging and applying a material to the object placed on the stage; a moving mechanism relatively moving the stage and application nozzle along the placement surface in a cross direction which crosses the rotational direction; a controller performing a control to rotate the stage on which the object is placed through the rotating mechanism while relatively moving the stage and application nozzle in the cross direction along the placement surface through the moving mechanism; and a cleaning apparatus cleaning the application nozzle.

Figure 1:
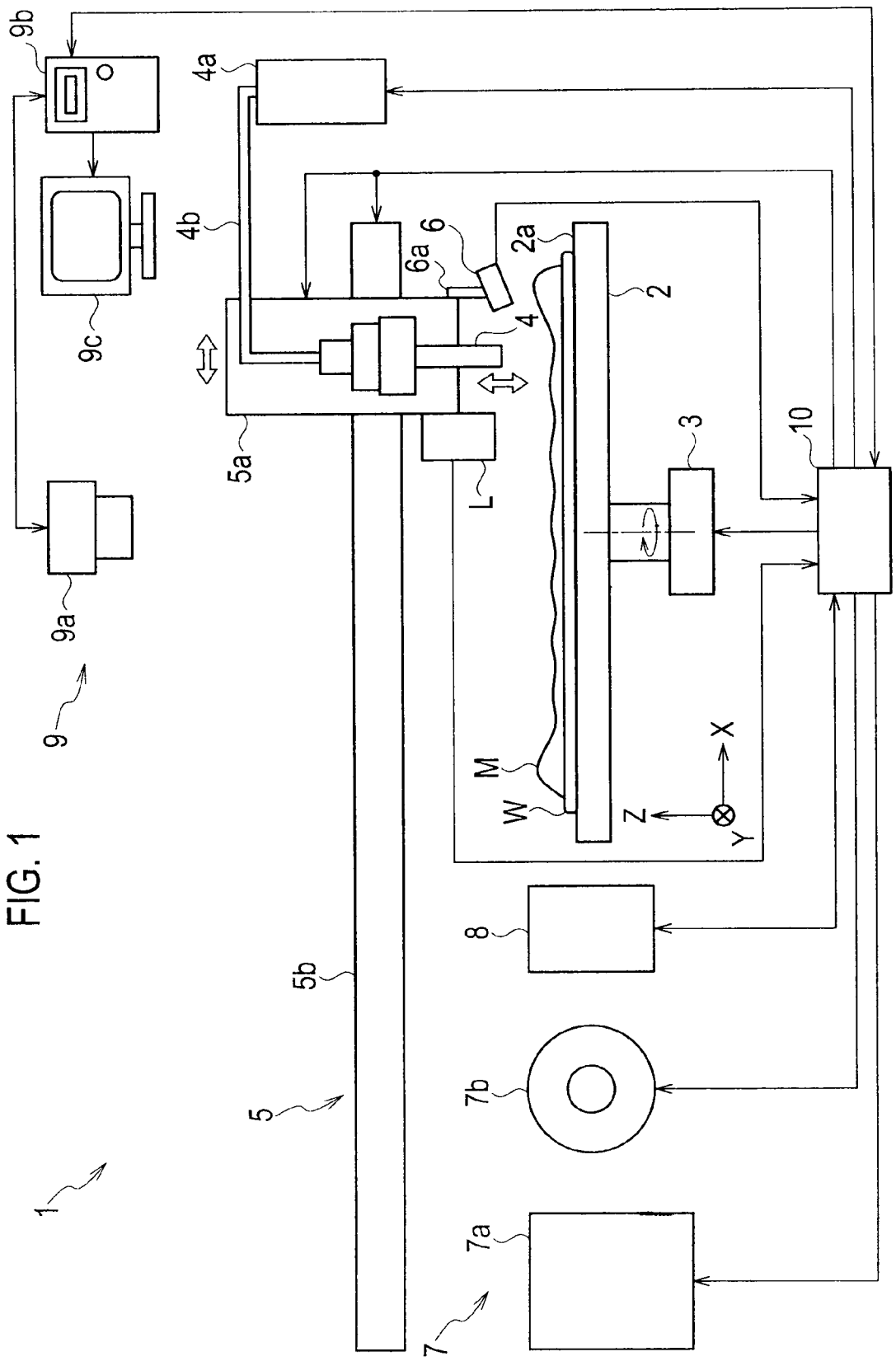
FIG. 1 is a schematic view schematically showing a constitution of a film foaming system according to an embodiment of the present invention.

An embodiment of the present invention is described with reference to the drawings. As shown in FIG. 1, a film forming system 1 according to the embodiment of the present invention includes a stage 2, a rotating mechanism 3, an application nozzle 4, a moving mechanism 5, an image acquiring section 6, a cleaning apparatus 7, an inspection apparatus 8, an observation apparatus 9, and a controller 10. On the stage 2, a wafer W as the object to be coated is placed. The rotating mechanism 3 is configured to rotate the stage 2 in a horizontal plane. The application nozzle 4 is configured to discharge a material from a tip thereof onto the wafer W for application. The moving mechanism 5 is configured to relatively move the application nozzle 4 and stage 2 in the horizontal direction. The image acquiring section 6 is configured to acquire an image of the application nozzle 4 which discharges the material. The cleaning apparatus 7 is configured to clean the application nozzle 4. The inspection apparatus 8 is configured to inspect the degree of contamination of the application nozzle 4. The observation apparatus 9 is configured to observe a film surface of a coating film M on the wafer W. The controller 10 is configured to control the mechanisms, apparatuses, and the like.

The stage 2 has a circular shape and is configured to be rotated in a horizontal plane by the rotating mechanism 3. The stage 2 includes a sucking mechanism sucking the wafer W placed thereon. The sucking mechanism fixes and holds the wafer W on the placement surface 2a of the stage 2. Examples of a sucking mechanism include an air sucking mechanism and the like.

The rotating mechanism 3 supports the stage 2 so that the stage 2 is rotatable in a horizontal plane and rotates the stage 2 in the horizontal plane around the center of the stage 2 with a driving source such as a motor. The wafer W placed on the stage 2 thus rotates in the horizontal plane.

The application nozzle 4 discharges the material which is to be formed into the coating film M. The application nozzle 4 continuously discharges the material from the tip thereof under pressure to apply the material to the wafer W placed on the stage 2. The application nozzle 4 is connected to a supply section 4a supplying the material through a supply tube 4b such as a tube or a pipe. The supply section 4a includes a tank reserving the material, a pump for supplying the material, a flow-rate regulation valve, and the like. The supply section 4a is controlled by the controller 10 for adjustment of the flow rate of the material discharged from the application nozzle 4.

The moving mechanism 5 includes a Z-axis moving mechanism 5a and an X-axis moving mechanism 5b. The Z-axis moving mechanism 5a supports the application nozzle 4 and moves the same in a Z-axis direction. The X-axis moving mechanism 5b supports the application nozzle 4 with the Z-axis moving mechanism 5a interposed therebetween and moves the same in an X-axis direction. The moving mechanism 5 positions the application nozzle 4 above the stage 2 and moves the application nozzle 4 relatively to the stage 2. Each of the Z- and X-axis moving mechanisms 5a and 5b is for example a liner motor moving mechanism including a linear motor as a driving source, a feed screw moving mechanism including a motor as a driving source, or the like.

The Z-axis moving mechanism 5a includes a distance measurement section L such as a reflective laser sensor. The distance measurement section L is moved in the X-axis direction together with the Z-axis moving mechanism 5a by the X-axis moving mechanism 5b and measures the distance to the wafer W on the stage 2. This makes it possible to obtain roughness of the coated surface of the wafer W, or a height profile of the coated surface of the wafer W.

The image acquiring section 6 acquires an image of the tip of the application nozzle 4 which is discharging the material to the wafer W placed on the stage 2. The image acquiring section 6 is provided for the Z-axis moving mechanism 5a through a supporting member 6a so as to detect excess material collecting on the application nozzle 4, that is, to acquire an image of the tip circumferential surface of the application nozzle 4.

Figure 2:
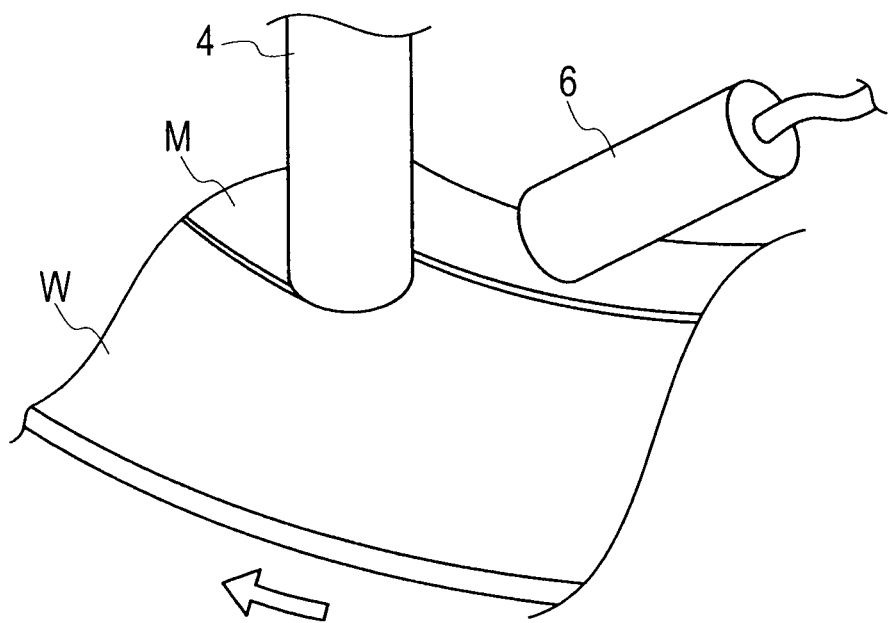
FIG. 2 is a perspective view showing an application nozzle provided for the film faulting system shown in FIG. 1 on which there is no excess material.

As shown in FIG. 2, the image acquiring section 6 is especially placed on the upstream side of the application nozzle 4 in the rotating direction of the wafer W. Examples of the image acquiring section 6 are an image pickup unit of a charge coupled device (CCD) camera, a sensor projecting light onto the material and detecting the reflected light, and the like. The film forming system 1 includes one image acquiring section 6 herein. However, the invention is not limited to this, and the number of image acquisition sections is not limited.

Figure 3:
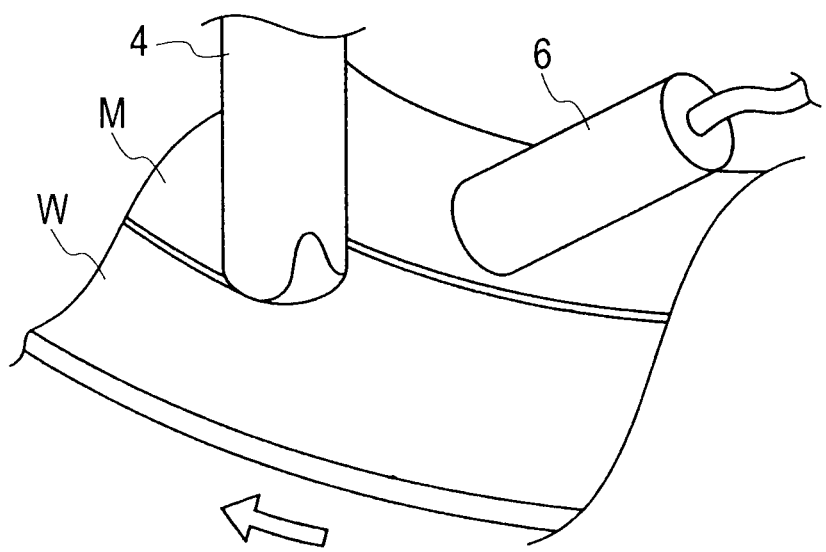
FIG. 3 is a perspective view showing the application nozzle provided for the film forming system shown in FIG. 1 on which there is a collection of excess material.

During the spiral coating, the application nozzle 4 discharges the material toward the wafer W placed on the rotary stage 2 while moving in the X-axis direction from the center of the wafer W toward the periphery to apply the material to the surface of the wafer W in a spiral form. In such spiral coating, as shown in FIG. 2, the material is normally applied to the wafer W placed on the stage 2 with no excess material collecting on the application nozzle 4. On the other hand, as shown in FIG. 3, excess material can go up and collect on the application nozzle 4 because of various causes including oscillation. If such excess material increasingly collects, the excess material forms a liquid collection at the tip of the application nozzle 4, and the liquid collection drops by its own weight. Such a drop of liquid therefore touches the substrate rotating during the application operation or scatters onto the coated surface. Alternatively, the drop of liquid rubs the material applied on the wafer W to make a non-application defect in the coating film.

Accordingly, the tip of the application nozzle 4 is monitored by the image acquiring section 6. The image acquiring section 6 acquires an image of the tip of the application nozzle 4 and inputs the image to the controller 10. The controller 10 performs image processing such as digitization for the inputted image and judges whether there is a collection of excess material on the application nozzle 4. The degree of excess material which collects on the application nozzle 4 is judged by measuring the excess material adhering to the circumferential surface of the application nozzle 4 by width, height from the bottom surface of the application nozzle 4, the position, area, fluctuation, combinations thereof, or the like.

If the width of the excess material or the height thereof from the bottom surface of the application nozzle 4 is more than a predetermined threshold value, it is judged that there is a collection of excess material on the application nozzle 4. With regard to the fluctuation in the collection of excess material on the application nozzle 4, images of the tip of the application nozzle 4 obtained at each predetermined time are compared, and it is judged that there is a collection of excess material on the application nozzle 4 when the fluctuation range thereof exceeds a predetermined threshold value. Monitoring the fluctuation can prevent that a small amount of excess material which collects to some extent on the tip circumferential surface of the application nozzle 4 suddenly falls because of oscillation or the like.

Again in FIG. 1, the cleaning apparatus 7 includes a liquid cleaning unit 7a and a roller cleaning unit 7b. The liquid cleaning unit 7a is configured to clean the tip of the application nozzle 4 with cleaning liquid. The roller cleaning unit 7b is configured to clean the tip of the application nozzle 4 with a roller. These liquid and roller cleaning units 7a and 7b are provided in a range where the application nozzle 4 is moved by the X-axis moving mechanism 5b.

Figure 4:
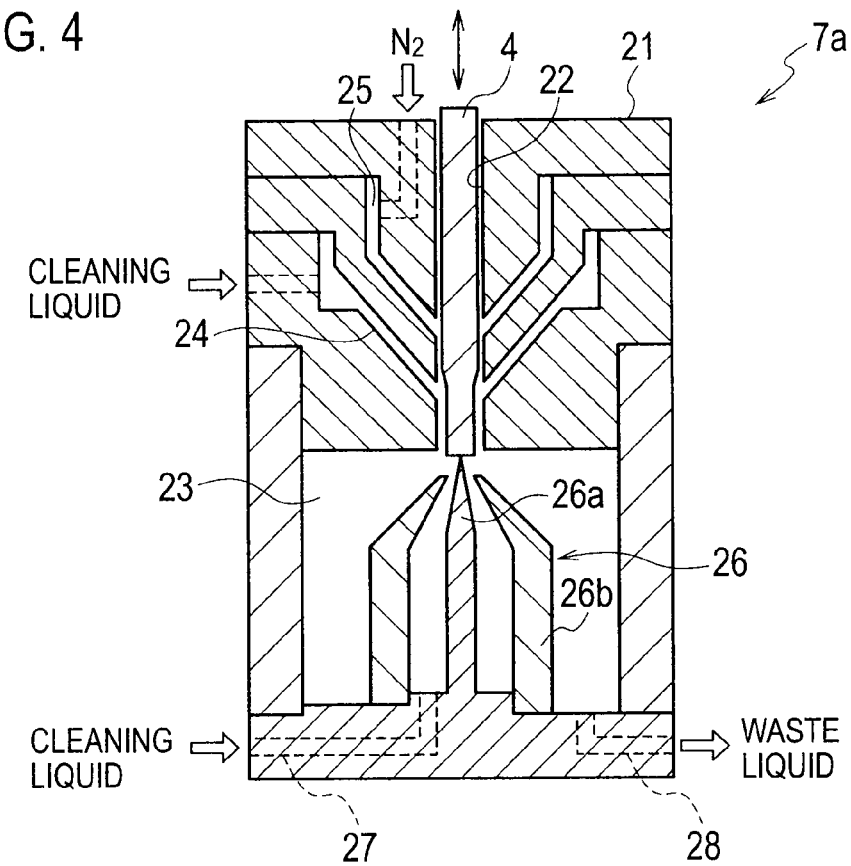
FIG. 4 is a cross-sectional view schematically showing a constitution of a liquid cleaning unit provided for the film forming system shown in FIG. 1.
Figure 5:
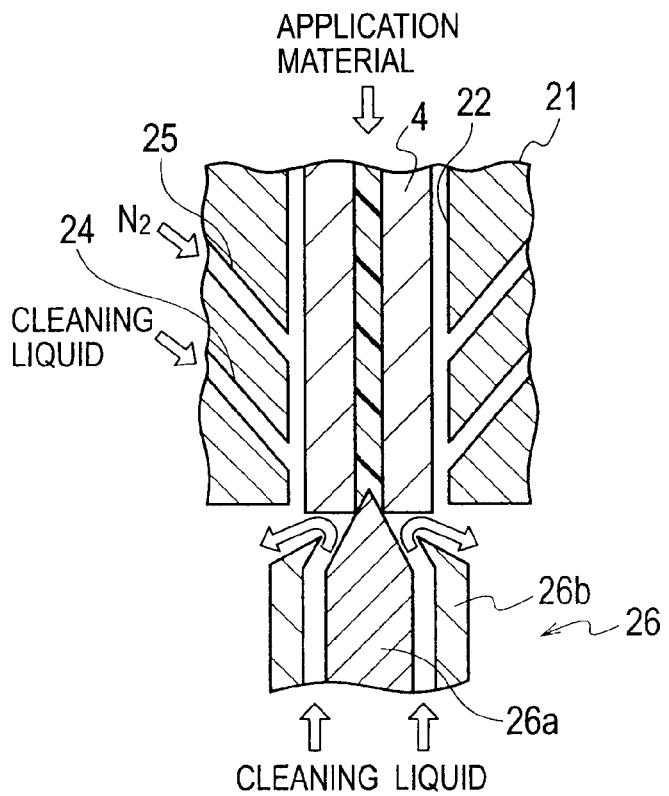
FIG. 5 is an enlarged cross-sectional view showing a part of the liquid cleaning unit shown in FIG. 4.

As shown in FIGS. 4 and 5, the liquid cleaning unit 7a accommodates the application nozzle 4 and then blocks the outlet of the application nozzle 4 while supplying the cleaning liquid to the tip of the application nozzle 4 for cleaning, thus removing extraneous matters adhering to the application nozzle 4 (the excess material or foreign substances). The application nozzle 4 is moved to face the liquid cleaning unit 7a by the X-axis moving mechanism 5b and is then moved down by the Z-axis moving mechanism 5a facing the liquid cleaning unit 7a to be accommodated in the liquid cleaning unit 7a.

The liquid cleaning unit 7a includes a casing 21, an accommodation hole 22, an internal space 23, a liquid supply channel 24, a gas supply channel 25, a guide portion 26, a liquid supply channel 27, and a liquid discharge channel 28. The accommodation hole 22 is provided in the casing 21 and is configured to accommodate the application nozzle 4. The internal space 23 communicates with the accommodation hole 22. The liquid supply channel 24 communicates with the accommodation hole 22 and is configured to supply the cleaning liquid to the circumferential surface of the application nozzle 4. The gas supply channel 25 communicates with the accommodation hole 22 and is configured to supply gas for drying such as nitrogen ($N_2$) gas. The guide portion 26 is configured to block the outlet of the application nozzle 4 and guide the cleaning liquid to the outlet surface of the application nozzle 4. The liquid supply channel 27 is configured to supply the cleaning liquid to the guide portion 26. The liquid discharge channel 28 is configured to discharge the cleaning liquid already used in cleansing as waste liquid waste.

The accommodation hole 22 is shaped in a circle to fit the shape of the application nozzle 4 and allows the application nozzle 4 to be inserted therein and removed therefrom. The internal space 23 has enough size to accommodate the guide portion 26. The bottom surface of the internal space lowers toward the connected end of the liquid discharge channel 28. The liquid supply channels 24 and 27 are connected through pipes to a liquid supply section which supplies the cleaning liquid. The liquid supply section is controlled by the controller 10. The gas supply channel 25 is connected through a pipe to a gas supply section which supplies gas. The gas supply section is also controlled by the controller 10.

The guide portion 26 includes a cylindrical blocking member 26a and a ring-shaped peripheral member 26b and is provided for the internal space 23. The tip of the blocking member 26a, which is configured to block the outlet of the application nozzle 4, gradually tapers to the top thereof. The peripheral member 26b surrounds the blocking member 26a at a predetermined distance from the blocking member 26a. Upper part of the peripheral member 26b is formed so as to gradually narrow toward the top of the blocking member 26a. The liquid supply channel 27 is connected to between the blocking and peripheral members 26a and 26b.

After accommodating the application nozzle 4 in the accommodation hole 22, the liquid cleaning unit 7a supplies the cleaning liquid through the liquid supply channel 24 to the circumferential surface of the application nozzle 4 to remove substances adhering to the circumferential surface of the application nozzle 4 (see FIG. 5). The liquid cleaning unit 7a supplies the cleaning liquid through the liquid supply channel 27 to between the blocking and peripheral members 26a and 26b and causes the cleaning liquid to pass therebetween and strike the outlet surface of the application nozzle 4, thus also removing substances adhering to the outlet surface (bottom surface) of the application nozzle 4 (see FIG. 5). Moreover, the liquid cleaning unit 7a discharges the liquid waste of the cleaning liquid through the liquid discharge channel 28. After finishing the discharge, the liquid cleaning unit 7a supplies gas through the gas supply channel 25 to the circumferential surface of the application nozzle 4 for drying the application nozzle 4. The application nozzle 4 does not move during the cleaning operation, but the embodiment of the invention is not limited to this. The application nozzle 4 may be rotated by a rotating mechanism, for example.

With such a cleaning operation, substances adhering to the application nozzle 4 are removed by the cleaning liquid, thus preventing degradation in the uniformity of film thickness due to contamination of the application nozzle 4. Moreover, since the outlet of the application nozzle 4 is blocked by the blocking member 26a, part of the material at the tip of the application nozzle 4 is more susceptible to changes in density due to the cleaning liquid than that in the case where the outlet of the application nozzle 4 is not blocked. It is therefore possible to prevent degradation in quality of the coating film due to the material changing in density. Moreover, the liquid cleaning unit 7a is provided in the range where the application nozzle 4 is moved by the moving mechanism 5 of the film forming system 1 and serves as a part of the film forming system 1. Accordingly, the cleaning time is shorter than that of the case where the application nozzle 4 is detached for cleaning, and the cleaning work is simplified.

Figure 6:
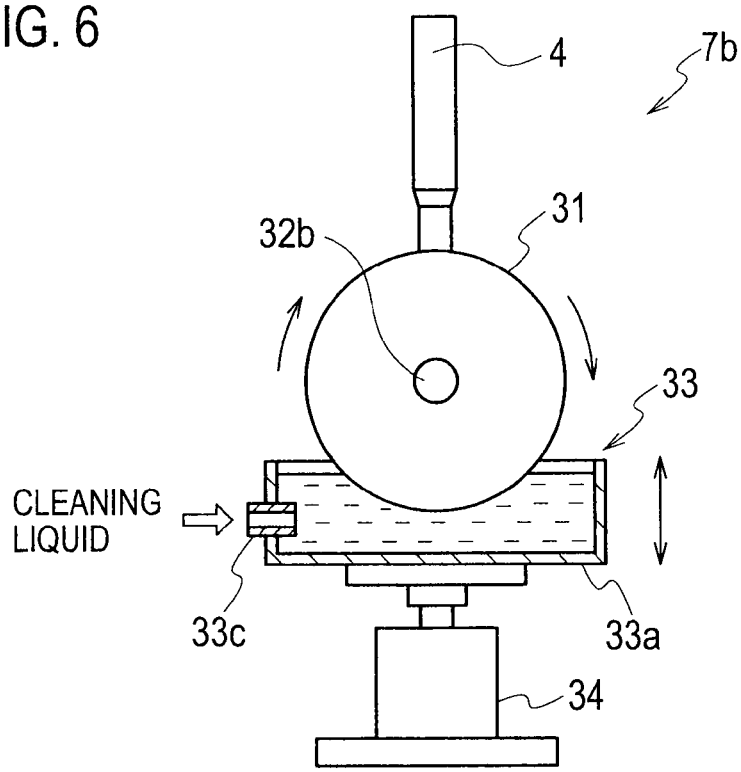
FIG. 6 is a cross-sectional front view schematically showing a constitution of a roller cleaning unit provided for the film forming system shown in FIG. 1.
Figure 7:
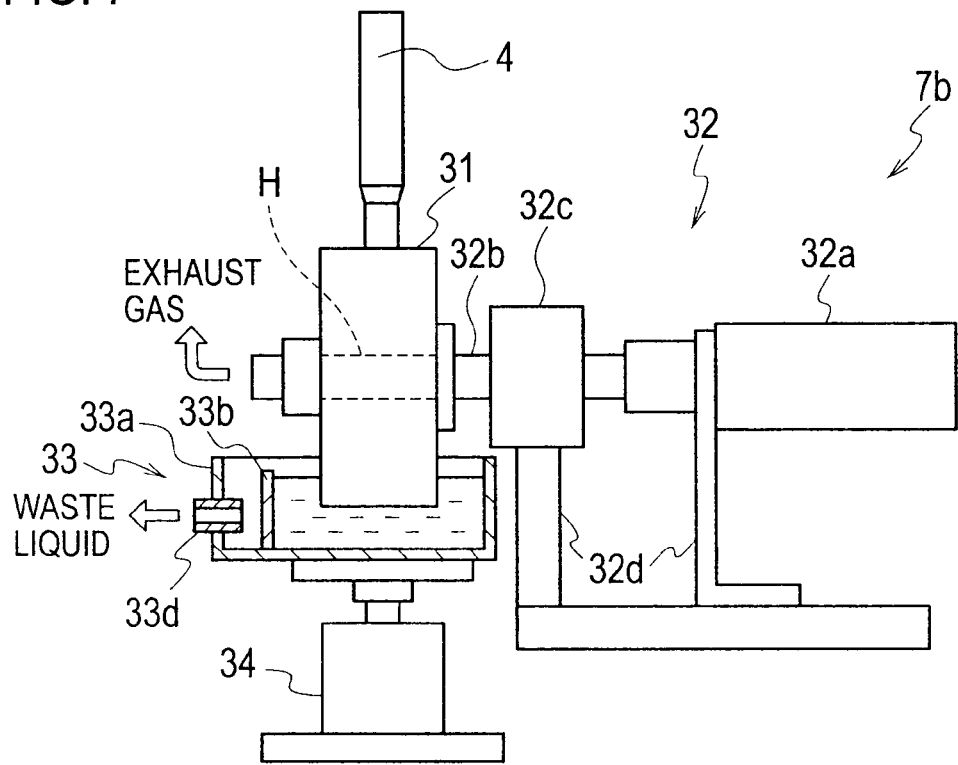
FIG. 7 is a cross-sectional side view schematically showing a constitution of the roller cleaning unit provided for the film forming system shown in FIG. 1.

As shown in FIGS. 6 and 7, the roller cleaning unit 7b cleans the tip of the application nozzle 4 with a roller member 31 having a liquid absorbing property absorbing the cleaning liquid and initializes the density of the material present at the tip (the outlet) of the application nozzle 4. The application nozzle 4 is moved so as to face the roller cleaning unit 7b by the X-axis moving mechanism 5b and is then moved down by the Z-axis moving mechanism 5a facing the roller cleaning unit 7b to come into contact with the roller member 31 of the roller cleaning unit 7b.

The roller cleaning unit 7b includes the roller member 31, a roller rotating mechanism 32 (see FIG. 7), a liquid bath 33, and a liquid bath moving mechanism 34. The roller member 31 is configured to come into contact with the application nozzle 4. The roller rotating mechanism 32 is configured to rotate the roller member 31. The liquid bath 33 is configured to reserve cleaning liquid to clean the roller member 31. The liquid bath moving mechanism 34 is configured to move the liquid bath 33 vertically (in the Z-axis direction).

The roller member 31 is a roller having a liquid absorbing property and is immersed in the cleaning liquid of the liquid bath 33 to be cleaned. The roller member 31 absorbs the material discharged when the application nozzle 4 performs dummy discharge. The material at the tip of the application nozzle 4 can change in density due to various causes including drying. Part of the material which changes in density is removed by the roller member 31, and the tip of the application nozzle 4 is then filled with the material having a normal density.

The roller rotating mechanism 32 includes a motor 32a as a rotation driving source (see FIG. 7), a rotary shaft 32b for the roller member 31, a bearing 32c (see FIG. 7), and a supporting member 32d (see FIG. 7). The rotary shaft 32b is coupled to the shaft of the motor 32a and is inserted in the bearing 32c. The supporting member 32d supports the bearing 32b and motor 32a at a predetermined height.

The rotary shaft 32b is cylindrical and hollow. An end of the rotary shaft 32b is closed by the rotary shaft of the motor 32a, and the other end thereof is opened. Part of the rotary shaft 32b which is brought into contact with the roller member 31 has a plurality of air-through holes H in a mesh. These air-through holes H are configured to allow air but not the cleaning liquid to pass through. When the roller member 31 rotates, therefore, air flows from the outer surface of the roller member 31 toward the rotary shaft 32b, passes through the air-through holes H of the rotary shaft 32b, flows within the rotary shaft 32b, and then exhausted from the open end of the rotary shaft 32b. Such an air flow (negative pressure) enhances the liquid absorbing property so that the cleaning liquid is smoothly absorbed from the liquid bath 33 to the surface of the roller member 31.

The liquid absorbing property of the roller member 31 is used, but the embodiment of the invention is not limited to this. For example, the air may be forcibly exhausted by an exhaust unit such as a pump which is connected to the open end of the rotary shaft 32b through an exhaust pipe.

The liquid bath 33 includes a case 33a, a liquid accommodation portion 33b (see FIG. 7), a supply port 33c (see FIG. 6), and a discharge port 33d (see FIG. 7). The liquid accommodation portion 33b is provided within the case 33a and is configured to reserve the cleaning liquid. The supply port 33c is formed in the case 33a and is configured to supply the cleaning liquid to the liquid reserving portion 33b. The discharge port 33d is formed in the case 33a and is configured to discharge the cleaning liquid overflowing from the liquid reserving portion 33b as liquid waste. The liquid bath 33 is configured to clean the roller member 31 with the cleaning liquid in the liquid accommodation portion 33b to remove from the roller member 31 the material that the roller member 31 absorbs from the application nozzle 4.

The dummy discharge of the application nozzle 4 starts with the roller member 31 being not immersed in the liquid bath and the application nozzle 4 being in contact with the roller member 31. The roller cleaning unit 7b rotates the roller member 31 with the roller rotating mechanism 32 and absorbs the material from the tip of the application nozzle 4 with the roller member 31 to remove a part of the material which changes in density. After the application nozzle 4 is raised and is separated from the roller member 31, the roller cleaning unit 7b elevates the liquid bath 33 with the liquid bath moving mechanism 34 and immerses the rotating roller member 31 in the liquid bath 33 to clean the roller member 31 with the cleaning liquid in the liquid bath 33.

The density of the material at the tip of the application nozzle 4 is initialized using the cleaning liquid herein, but the embodiment of the invention is not limited to this. For example, the material at the tip of the application nozzle 4 may be blown away by horizontally jetting gas onto the tip of the application nozzle 4 such as air with a gas injector (for example, in the X-axis direction) and then received by a receiver member facing the gas injector.

With such a cleaning operation, the density of the material at the tip of the application nozzle 4 is initialized. In other words, a small amount of the material at the tip of the application nozzle 4, which changes in density due to drying and the like, is removed, and the tip of the application nozzle is filled with the material of a normal density, thus removing the contamination of the application nozzle 4 due to the material having abnormal density. This can prevent the uniformity in film thickness from being degraded due to the contamination of the application nozzle 4. Moreover, substances adhering to the outlet surface of the application nozzle 4 are also removed. The roller cleaning unit 7b is provided in the range where the application nozzle 4 is moved by the moving mechanism 5 of the film forming system 1 and serves as a part of the film forming system 1. Accordingly, the cleaning time is shorter than that in the case where the application nozzle 4 is detached for cleaning. Furthermore, the cleaning operation is more simplified.

Figure 8:
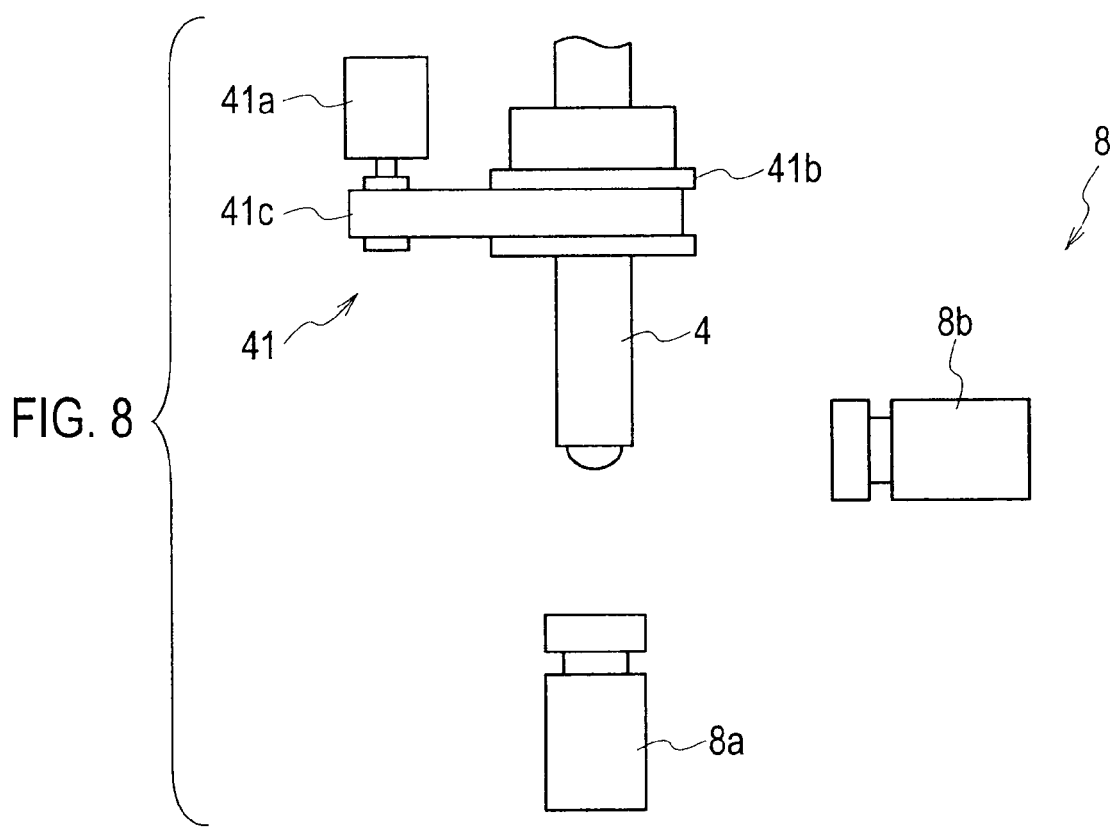
FIG. 8 is a schematic view schematically showing a constitution of an inspection apparatus provided for the film forming system shown in FIG. 1.

As shown in FIG. 8, the inspection apparatus 8 includes first and second inspection image acquiring units 8a and 8b. The first inspection image acquiring unit 8a is configured to acquire an image of the outlet surface (the bottom surface) of the application nozzle 4. The second inspection image acquiring unit 8b is configured to acquire an image of the tip circumferential surface of the application nozzle 4. The application nozzle 4 is moved so as to face the inspection apparatus 8 by the X-axis moving mechanism 5b and is moved down facing the inspection apparatus 8 to a predetermined image acquisition position by the Z-axis moving mechanism 5a.

Figure 9:
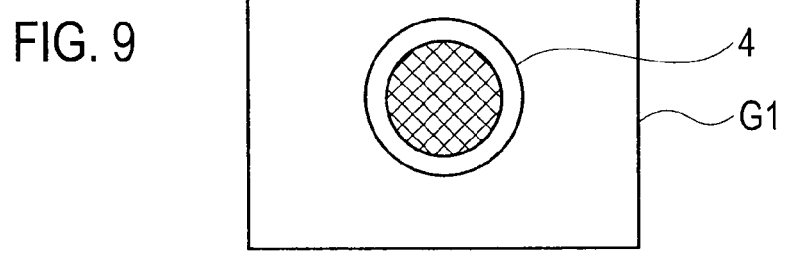
FIG. 9 is a plan view showing a first inspection image obtained by the inspection apparatus shown in FIG. 8.
Figure 10:
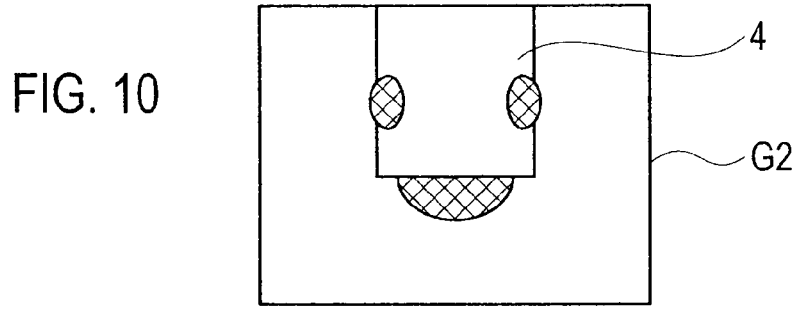
FIG. 10 is a plan view showing a second inspection image obtained by the inspection apparatus shown in FIG. 8.

The first inspection image acquiring unit 8a acquires for example an image G1 of the outlet surface of the application nozzle 4 as shown in FIG. 9 and inputs the image G1 to the controller 10. On the other hand, the second inspection image acquiring unit 8b acquires an image G2 of the tip circumferential surface of the application nozzle 4 as shown in FIG. 10 and inputs the image G2 to the controller 10. The image G2 shows excess material adhering to the tip circumferential surface of the application nozzle 4. Examples of the first and second inspection image acquiring units 8a and 8b are pickup units of charge coupled device (CCD) cameras and the like, sensors projecting light onto the material and detecting the reflected light, and the like.

The application nozzle 4 is configured to be rotated by the nozzle rotating mechanism 41. The nozzle rotating mechanism 41 includes a motor 41a as a rotation driving source, a pulley 41b fixed to the application nozzle 4, and a belt 41c wound around the pulley 41b and motor 41a. The nozzle rotating mechanism 41 is controlled by the controller 10 and drives the motor 41a to rotate the application nozzle 4 through the belt 41c and pulley 41b. For example, when the second inspection image acquiring unit 8b acquires an image, the application nozzle 4 is rotated by the nozzle rotating mechanism 41. This allows the second inspection image acquiring unit 8b to acquire the entire image of the tip circumferential surface of the application nozzle 4.

The film forming system 1 includes the single second inspection image acquiring unit 8b, and the entire image of the tip circumferential surface of the application nozzle 4 is obtained by rotating the application nozzle 4. However, the embodiment of the invention is not limited to this. For example, the entire image of the tip circumferential surface of the application nozzle 4 may be obtained by two second inspection image acquiring units provided so as to sandwich the application nozzle 4.

With such an inspection operation, the image of the outlet surface of the application nozzle 4 is acquired by the first inspection image acquiring unit 8a, and the image of the tip circumferential surface of the application nozzle 4 is acquired by the second inspection image acquiring unit 8b. These images of the outlet surface and tip circumferential surface are inputted into the controller 10 and are subjected to image processing such as binarization for judgment of the presence of extraneous matters adhering to the application nozzle. The cleaning operation is performed if there is an extraneous matter adhering to the application nozzle 4, and the excess material adhering to the application nozzle 4 is therefore surely removed. This prevents the degradation of the uniformity in film thickness due to contamination of the application nozzle 4. Moreover, the inspection apparatus 8 is provided in the range where the application nozzle 4 is moved by the moving mechanism 5 of the film forming system 1 and serves as a part of the film forming system 1. Accordingly, the inspection time is shorter than that in the case where the application nozzle 4 is detached for inspection, and the inspection operation is simpler.

Again FIG. 1, the observation apparatus 9 includes an observation image acquiring unit 9a, an image processing unit 9b, and a display unit 9c. The observation image acquiring unit 9a is configured to acquire an image of the coating film M of the wafer W placed on the stage 2. The image processing unit 9b is configured to process the image acquired by the observation image acquiring unit 9a. The display unit 9c is configured to display the image subjected to the image processing and the like.

The observation image acquiring unit 9a is provided above the stage 2 so as to observe the entire surface of the wafer W on the stage 2 and is configured to acquire an image of the entire surface of the coating film M of the wafer W. Examples of the observation image acquiring unit 9a are a pickup unit of a CCD camera or the like, a sensor projecting light onto the material and detecting the reflected light thereof, and the like. Examples of the display unit 9c are a liquid crystal display (LCD), a cathode ray tube (CRT), and the like.

The image processing unit 9b communicates with the controller 10 and sends an image subjected to the image processing to the controller 10. The controller 10 judges the presence of non-application defects or foreign substances and the degree of variations in film thickness based on the image sent by the image processing unit 9b and information on the relationship between the film thickness and image density. The image processing unit 9b is provided for the observation apparatus 9 herein, but the embodiment of the invention is not limited to this. For example, the image processing unit 9b may be provided for the controller 10, or the controller 10 may perform the image processing instead of the image processing unit 9b.

The controller 10 includes a microcomputer concentrically controlling each sections and a storage unit storing various types of programs and information. The storage unit is a memory, a hard disk drive (HDD), or the like. The controller 10 controls the rotating and moving mechanisms 3 and 5 and the like to rotate the stage 2 on which the wafer W is placed and cause the application nozzle 4 to discharge the material from the tip while linearly moving the application nozzle 4 from the center of the substrate (or the periphery of the substrate) toward the periphery of the substrate (or the center of the substrate). The controller 10 makes a spiral trajectory of application, thus forming a film on the entire surface of the substrate (spiral coating).

Next, a film forming process (film forming method) performed by the aforementioned film forming system 1 is described. The controller 10 of the film forming system 1 performs the film forming process based on the various types of programs and various types of information (including information on conditions for application).

Figure 11:
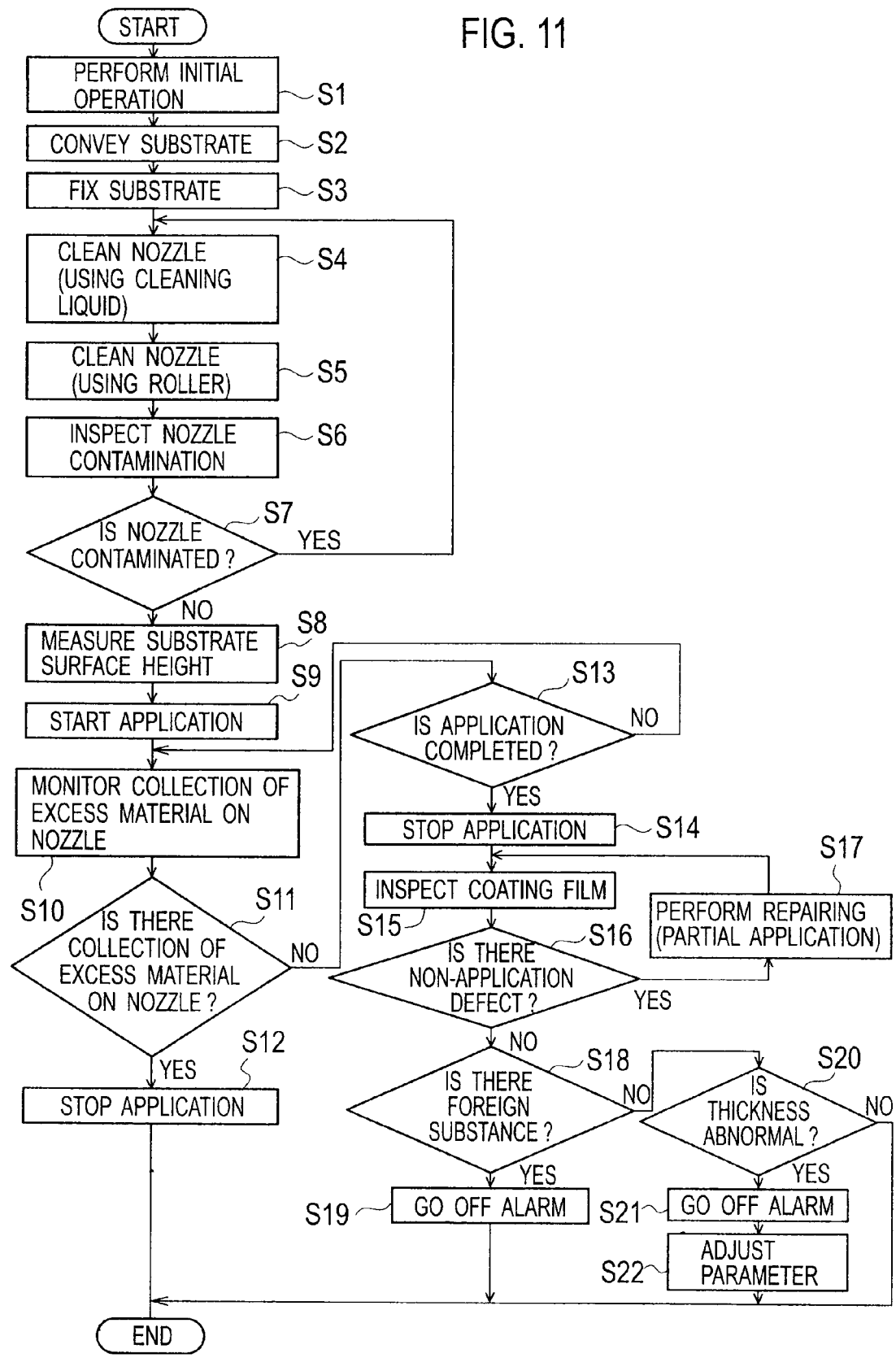
FIG. 11 is a flowchart showing a procedure of film formation performed by the film forming system shown in FIG. 1.

As shown in FIG. 11, first, an initial operation including origin return is performed (step S1); next, the wafer W as a substrate is conveyed onto the stage 2 by a conveying mechanism by robot handling or the like (step S2); and then, the wafer W is fixed to the stage 2 by the sticking mechanism (step S3).

Thereafter, nozzle cleaning (using the cleaning liquid) is performed by the liquid cleaning unit 7a (step S4); nozzle cleansing (using the roller) is performed by the roller cleaning unit 7b (step S5); nozzle contamination inspection is performed by the inspection apparatus 8 (step S6); and then it is judged whether the nozzle is contaminated (step S7).

At the cleaning by the liquid cleaning unit 7a, after the application nozzle 4 is moved down by the Z-axis moving mechanism 5a and is accommodated in the accommodation hole 22, the cleaning liquid is supplied to the tip circumferential surface and outlet surface (bottom surface) of the application nozzle 4 and cleanses the tip circumferential surface and outlet surface. The extraneous matters adhering to the application nozzle 4 (the excess material or foreign substances) are thus removed. Thereafter, gas for drying is supplied to the tip circumferential surface of the application nozzle 4 to dry the application nozzle 4. After being dried, the application nozzle 4 is raised by the Z-axis moving mechanism 5a and is then moved so as to face the roller cleaning unit 7b by the X-axis moving mechanism 5b.

At the cleaning by the roller cleaning unit 7b, the application nozzle 4 is moved down by the Z-axis moving mechanism 5a facing the roller cleaning unit 7b at the aforementioned position and comes into contact with the roller member 31. The dummy discharge of the application nozzle 4 is then started. The roller member 31 is rotated by the roller rotating mechanism 32, and the material at the tip of the application nozzle 4 is absorbed by the roller member 31. Accordingly, a part of the material which changes in density is removed. At this time, the roller member 31 is not immersed in the liquid bath 33. After the application nozzle 4 is raised by the Z-axis moving mechanism 5a and is separated from the roller 31, the liquid bath 33 is raised by the liquid bath moving mechanism 34 while the roller member 31 is rotated. The roller member 31 is thus immersed in the liquid bath 33 and is cleaned by the cleaning liquid of the liquid bath 33. After the cleaning, the liquid bath 33 is moved down by the liquid bath moving mechanism 34.

In the nozzle contamination inspection, the image of the outlet surface (bottom surface) of the application nozzle 4 is acquired by the first inspection image acquiring unit 8a, and simultaneously the image of the tip circumferential surface of the application nozzle 4 is acquired by the second inspection image acquiring unit 8b. These images of the outlet surface and tip circumferential surface are inputted into the controller 10. These images are then subjected to the image processing including binarization for judgment of the presence of extraneous matters adhering to the application nozzle 4. For example, it is judged that the application nozzle 4 is contaminated with an extraneous matter adhering to the application nozzle 4 if the size of the extraneous matter exceeds a predetermined referential value, for example.

If it is judged that the application nozzle 4 is contaminated (if YES in the step S7), the process is returned to the step S4, where the nozzle cleaning and nozzle contamination inspection are performed again. On the other hand, if it is judged that the application nozzle 4 is not contaminated (if NO in the step 7), the surface height of the wafer W (substrate surface height) is measured (step S8), and then application is started (step S9).

At the measurement of the height surface, the distance measuring unit L moves from the original position in the X-axis direction together with the Z-axis moving mechanism 5a by the X-axis moving mechanism 5b while measuring the distance to the wafer W placed on the stage 2. The surface roughness or height profile of the coating surface of the wafer W on the stage 2 is acquired and stored in the storage unit of the controller 10.

Using the aforementioned height profile before the application, vertical gap between the application nozzle 4 and the coating surface of the wafer W is adjusted to a setting value. For example, the difference between the average of the vertical gap and the setting value thereof is calculated to obtain a correction amount, by which the application nozzle 4 is moved in the Z-axis direction by the Z-axis moving mechanism 5a. Thus, the gap between the application nozzle 4 and the coating surface of the wafer W is adjusted to the desired gap During the application, the stage 2 is rotated by the rotating mechanism 3. While the wafer W on the stage 2 is rotating, the application nozzle 4 is moved at a constant speed by the X-axis moving mechanism 5b together with the Z-axis moving mechanism 5a from the original position at the center of the wafer W in the X-axis direction, or from the center of the wafer W to the periphery. At this time, the application nozzle continuously discharges the material onto the coating surface of the wafer W while moving, so that the material is applied on the coating surface in a spiral fashion (spiral coating). The coating film M is thus formed on the coating surface of the wafer W.

After such application is started, a collection of excess material adhering to the application nozzle 4 is monitored (step S10), and it is then judged whether there is a collection of excess material adhering to the application nozzle 4 (step S11). If it is judged that there is a collection of excess material adhering to the application nozzle 4 (if YES in the step S11), the application is stopped (step S12), and the process is terminated.

At the monitoring of a collection of excess material, the tip of the application nozzle 4 is monitored by the image acquiring section 6 during the application operation, and continuous images of the tip are acquired by the image acquiring section 6. These images are subjected to the image processing such as binarization by the controller 10, and it is judged whether there is a collection of excess material adhering to the application nozzle 4. The degree of excess material which collects on the application nozzle 4 is judged by measuring the excess material adhering to the application nozzle 4 by width, height from the bottom surface of the application nozzle 4, position, area, fluctuation, combinations thereof, and the like.

On the other hand, if it is judged that there is no collection of excess material (if NO in the step S11), it is judged whether the application is completed (step S13). If it is judged that the application is not completed (if NO in the step S13), the process is returned to the step S10, and the collection of excess material is monitored during the application operation.

On the other hand, if it is judged that the application is completed (if YES in the step S13), the application is stopped (step S14). The application nozzle 4 is then raised by the Z-axis moving mechanism 5a, and the coating film M on the wafer W is observed or inspected by the observation apparatus 9 (step S15). It is then judged whether the coating film M includes a non-application defect (step S16). If it is judged that there is a non-application defect (if YES in the step S16), partial application or repairing is performed (step S17), and the procedure is returned to the step S15 for inspection again.

On the other hand, if there is no non-application defect (if NO in the step S16), it is judged whether any foreign substance is present in the coating film M (step S18). If it is judged that there is a foreign substance in the coating film M (if YES in the step S18), an alarm goes off (step S19), and the process is terminated.

On the other hand, if it is judged that there is no foreign substance in the coating film M (if NO in the step S18), it is then judged whether the coating film M has abnormal thickness (step S20). If it is judged that the thickness of the coating film M is abnormal (if YES in step S20), an alarm goes off (step S21). Subsequently, parameters for film formation (the application condition information) are adjusted (step S22), and the process is terminated. On the other hand, if it is judged that the coating film M has normal thickness (if NO in the step S20), the process is directly terminated.

At the observation (inspection) of the coating film M, the application nozzle 4 is retracted to a stand-by position by the X-axis moving mechanism 5b, and the image of the application film M on the wafer W is acquired by the observation image acquiring unit 9a. The acquired image is processed by the image processing unit 9b and is displayed on the display unit 9c. The acquired image is also sent to the controller 10, where the presence of non-application defects and foreign substances and abnormal film thickness are judged based on the density information of the image and the information on the relationship between the film thickness and image density.

With regard to the non-application defects, it is judged that there is a non-application defect when a part of the image has an extremely low image density, or a part of the film has a thickness of nearly zero. The position information of the non-application defect is stored in the storage unit of the controller 10 and is used for repairing including partial application. With regard to the foreign substances, it is judged that there is a foreign substance when a part of the image has an extremely high image density or a part of the film is extremely thick. With regard to the variation in film thickness, it is judged that the film thickness is abnormal when the variation in image density of the image or the variation in thickness is not less than a threshold value.

When there is a collection of excess material on the application nozzle 4 in the step S11, the application is stopped in the step S12, and then the application nozzle 4 is cleaned, for example. However, the embodiment of the invention is not limited to this. For example, the amount of material discharged from the application nozzle 4 or the gap between the application nozzle 4 and wafer W may be adjusted so that the excess material does not collect on the application nozzle 4. At this time, the controller 10 adjusts the amount of material discharged by the application nozzle 4 or the gap between the application nozzle 4 and wafer W by controlling the supply unit 4a and Z-axis moving mechanism 5a so that the collection of excess material is not more than a predetermined limitation value.

Moreover, the application nozzle 4 is cleaned before the application, but the embodiment of the invention is not limited to this. The application nozzle 4 may be also cleaned after the application. When the application nozzle 4 is neglected after the application is finished, the material at the tip of the application nozzle 4 or foreign substances adhering thereto dries out, and removal of the same is sometimes difficult. Accordingly, it is preferred that the application nozzle 4 is cleaned at a predetermined time also after the application. The application nozzle 4 is in a stand-by mode either before or after the application.

The application nozzle 4 is inspected after the application herein, but the embodiment of the invention is not limited to this. The application nozzle 4 may be inspected before the application. This prevents the application nozzle 4 which does not need to be cleaned from being cleaned, thus shortening the maintenance time. When the gap between the application nozzle 4 and wafer W is very small, the application nozzle 4 gets contaminated by only the application. The application nozzle 4 is therefore cleaned first and then inspected.

As described above, according to the embodiment of the present invention, the spiral coating is performed by rotating the stage 2 on which the wafer W is placed with the rotating mechanism 3 while relatively moving the stage 2 and application nozzle 4 along the placement surface 2a of the stage 2 in the X-axis direction by the moving mechanism 5 and applying the material to the wafer W on the stage 2 with the application nozzle 4. Furthermore, excess substances adhering to the tip of the application nozzle 4 and a part of the material which changes in density are removed by cleaning the application nozzle 4 with the cleaning apparatus 7 while the application nozzle 4 is in the stand-by mode.

Compared to the spin coating, the above-described spiral coating prevents the material from scattering onto the side or rear surfaces of the wafer W, thus eliminating the need for a cover. Accordingly, the maintenance time is shortened, and furthermore, the amount of material used is degraded. Moreover, the application nozzle 4 is cleaned by the cleaning apparatus 7, and excess substances adhering to the tip of the application nozzle 4 or the material which changes in density are removed to eliminate the contamination due to those substances and material adhering to the application nozzle 4. This increases the material use efficiency and the operating ratio and prevents the uniformity in film thickness from being reduced due to the contamination of the application nozzle 4 also in an application method necessary to form a thin film in which the application nozzle 4 is brought close to the wafer W.

The images of the application nozzle 4 are acquired by the inspection apparatus 8, and the inspection is performed for the presence of excess substances adhering to the application nozzle 4 (the adherence degree of the substances) to judge the presence of excess substances adhering to the tip of the application nozzle 4. The cleaning operation is performed when there is an excess substance adhering to the application nozzle 4. Accordingly, the excess substances adhering to the tip of the application nozzle 4 and the material which changes in density can be surely removed, and the contamination of the application nozzle 4 due to those excess substances and material can be eliminated. It is therefore possible to surely prevent that the uniformity in film thickness is degraded due to the contamination of the application nozzle 4.

Furthermore, the cleaning and inspection apparatuses 7 and 8 are provided in the range where the application nozzle 4 is moved by the moving mechanism 5 of the film forming system 1 to serve as a part of the film forming system 1. The cleaning and inspection time is therefore shorter than that in the case where the application nozzle 4 is detached for cleaning and inspection. Furthermore, the cleaning and inspection operations can be simplified. Similarly, the observation apparatus 9 operates as a part of the film forming system 1. It is therefore possible to provide shorter observation time and more simple observation operation than in the case where the wafer W is detached for observation (inspection) by another apparatus after the application.

OTHER EMBODIMENTS

For example, in the aforementioned embodiment of the invention, the wafer W is used as an object to be coated. However, the embodiment of the invention is not limited to this, and the object to be coated may be circular or non-circular glass substrates or the like.

While certain embodiments have been described, these embodiments have been presented by way of example only, and are not intended to limit the scope of the inventions. Indeed, the novel systems and methods described herein may be embodied in a variety of other forms; furthermore, various omissions, substitutions and changes in the form of the systems and methods described herein may be made without departing from the spirit of the inventions. The accompanying claims and their equivalents are intended to cover such forms or modifications as would fall within the scope and spirit of the inventions.

What is claimed is:

1. A film forming system comprising:
  a stage including a placement surface on which an object to be coated is placed;
  a rotating mechanism configured to rotate the stage in a rotational direction along the placement surface;
  an application nozzle configured to discharge a material onto the object placed on the stage for application;
  a moving mechanism configured to relatively move the stage and the application nozzle along the placement surface in a cross direction crossing the rotational direction;
  a controller configured to perform a control to rotate the stage on which the object is placed through the rotating mechanism while relatively moving the stage and application nozzle along the placement surface in the cross direction through the moving mechanism and applying the material to the object on the stage through the application nozzle;
  a cleaning apparatus configured to clean the application nozzle; and
  an image acquiring unit configured to acquire an image of the application nozzle discharging the material to the object placed on the stage during application of the material to the object, the image acquiring unit being placed on an upstream side of the application nozzle in a rotating direction of the stage,
  wherein the controller judges a degree of excess material collected on an outside of the application nozzle based on the image on the upstream side of the application nozzle acquired by the image acquiring unit, and
  the controller is configured to perform at least one of stopping application of the material to the object, adjustment of an amount of the material discharged from the application nozzle, or adjustment of a gap between the application nozzle and the object based on the controller judging presence of a collection of the excess material on the outside of the application nozzle, when the controller judges a width of the excess material or a height of the excess material from a bottom surface of the application nozzle is more than a predetermined threshold value, or when the controller determines images of a tip of the application nozzle obtained at each predetermined time are compared and a fluctuation range of the excess material exceeds a predetermined threshold value.

2. The film forming system of the claim 1, further comprising an inspection apparatus configured to inspect the presence of a substance adhering to the application nozzle,
  wherein the cleaning apparatus cleans the application nozzle in the presence of the substance adhering to the application nozzle.

3. The film forming system of the claim 1, further comprising an observation apparatus configured to observe a coating film of the material on the object placed on the stage.

4. The film forming system of the claim 1, further comprising an observation apparatus configured to observe a coating film of the material on the object placed on the stage, wherein
  based on a result of observation of the coating film through the observation apparatus,
  when there is a non-application defect in the coating film, partial application is performed,
  when there is a foreign substance in the application film, an alarm is activated, and
  when the coating film has abnormal thickness, an alarm is activated, and parameters for film formation are adjusted.

5. The film forming system of the claim 1, wherein the image acquiring unit acquires an image of an outlet surface of the application nozzle.

6. The film forming system of the claim 1, wherein the cleaning apparatus has a structure to block the outlet of the application nozzle.

7. The film forming system of the claim 1, wherein the controller compares images of the application nozzle obtained at each predetermined time and judges that there is the collection of excess material on the application nozzle when the fluctuation range thereof exceeds a predetermined threshold value.

* * * * *